US012772376B2

(12) United States Patent
Seo et al.

(10) Patent No.: US 12,772,376 B2
(45) Date of Patent: Oct. 20, 2026

(54) SURFACE-TREATED COPPER FOIL WITH HEAT RESISTANCE, AND COPPER CLAD LAMINATE AND PRINTED WIRING BOARD INCLUDING THE SAME

(71) Applicant: Lotte Energy Materials Corporation, Jeollabuk-do (KR)

(72) Inventors: Jung Woo Seo, Jeollabuk-do (KR); Chang Yol Yang, Jeollabuk-do (KR); Kideok Song, Jeollabuk-do (KR); Eun Sil Choi, Jeollabuk-do (KR)

(73) Assignee: LOTTE ENERGY MATERIALS CORPORATON, Jeollabuk-do (KR)

( * ) Notice: Subject to any disclaimer, the term of this patent is extended or adjusted under 35 U.S.C. 154(b) by 213 days.

(21) Appl. No.: 18/721,335

(22) PCT Filed: Jul. 25, 2022

(86) PCT No.: PCT/KR2022/010869
§ 371 (c)(1),
(2) Date: Jun. 18, 2024

(87) PCT Pub. No.: WO2023/120855
PCT Pub. Date: Jun. 29, 2023

(65) Prior Publication Data

US 2025/0365863 A1 Nov. 27, 2025

(30) Foreign Application Priority Data

Dec. 22, 2021 (KR) ........................ 10-2021-0185373

(51) Int. Cl.
*H05K 1/09* (2006.01)
*B32B 15/08* (2006.01)
(Continued)

(52) U.S. Cl.
CPC ............... *H05K 1/09* (2013.01); *H05K 3/384* (2013.01); *H05K 2201/015* (2013.01);
(Continued)

(58) Field of Classification Search
CPC ...... H05K 3/384; H05K 3/022; C23C 28/321; C23C 28/3225; C25D 5/10; C25D 5/605
See application file for complete search history.

(56) References Cited

U.S. PATENT DOCUMENTS 5,858,517 A * 1/1999 Tagusari ................ H05K 3/384 428/209
2003/0148136 A1* 8/2003 Yamamoto ............ H05K 3/384 428/607

(Continued)

FOREIGN PATENT DOCUMENTS

CN 1545570 A 11/2004
EP 0785295 B1 7/2003

(Continued)

OTHER PUBLICATIONS

European Search Report (ESR) from corresponding EP Application No. 22911495.4, issued on Sep. 11, 2025.

(Continued)

*Primary Examiner* — Timothy J Thompson
*Assistant Examiner* — Amol H Patel
(74) *Attorney, Agent, or Firm* — Harness, Dickey & Pierce, P.L.C.

(57) ABSTRACT

Disclosed is a surface-treated copper foil having long-term high-temperature reliability and being suitable for use in high-frequency circuits due to a low transmission loss, wherein the surface-treated copper foil has a surface treatment layer, the surface treatment layer including: a primary particle layer containing Cu or Cu alloy particles formed on at least one surface of an original copper foil; and a (Continued)

secondary particle layer containing Zn particles formed on the primary particle layer, the secondary particle layer being composed of particle clusters formed by clustering of a plurality of Zn particles.

15 Claims, 4 Drawing Sheets

(51) Int. Cl.

| | |
|---|---|
| ***B32B 15/20*** | (2006.01) |
| ***C23C 22/24*** | (2006.01) |
| ***C23C 28/00*** | (2006.01) |
| ***C25D 5/00*** | (2006.01) |
| ***C25D 5/10*** | (2006.01) |
| ***C25D 7/06*** | (2006.01) |
| ***C25D 9/08*** | (2006.01) |
| ***H05K 1/03*** | (2006.01) |
| ***H05K 3/02*** | (2006.01) |
| ***H05K 3/38*** | (2006.01) |

(52) U.S. Cl.
CPC .................. *H05K 2201/032* (2013.01); *H05K 2201/0355* (2013.01); *H05K 2203/0307* (2013.01); *H05K 2203/0723* (2013.01)

(56) References Cited

U.S. PATENT DOCUMENTS

| | | | | |
|---|---|---|---|---|
| 2004/0209109 | A1 | 10/2004 | Tsuchida et al. | |
| 2005/0175826 | A1 | 8/2005 | Suzuki | |
| 2013/0084463 | A1 | 4/2013 | Fujisawa | |
| 2018/0226655 | A1* | 8/2018 | Arai | C25D 5/611 |
| 2019/0145014 | A1* | 5/2019 | Chen | C25D 5/12 205/152 |
| 2023/0276579 | A1* | 8/2023 | Nakajima | H05K 1/09 |
| 2024/0215172 | A1* | 6/2024 | Okamoto | H05K 3/389 |

FOREIGN PATENT DOCUMENTS

| | | | |
|---|---|---|---|
| JP | S61-229531 | A | 10/1986 |
| JP | H09-195096 | A | 7/1997 |
| JP | H11-340596 | A | 12/1999 |
| JP | 2002-176268 | A | 6/2002 |
| JP | 2003-211616 | A | 7/2003 |
| JP | 2004-238647 | A | 8/2004 |
| JP | 2010-013738 | A | 1/2010 |
| JP | 2012-004221 | A | 1/2012 |
| JP | 2012-112009 | A | 6/2012 |
| JP | 2016065267 | A | 4/2016 |
| JP | 2018090903 | A | 6/2018 |
| JP | 2018-125280 | A | 8/2018 |
| KR | 10-0291856 | B1 | 6/2001 |
| KR | 10-0613958 | B1 | 8/2006 |
| KR | 10-0857311 | B1 | 9/2008 |
| KR | 2009-0093466 | A | 9/2009 |
| TW | 410533 | B | 11/2000 |

OTHER PUBLICATIONS

Office Action from corresponding Japanese Patent Application No. 2024-537474 dated Jun. 10, 2025.
International Search Report from corresponding PCT Application No. PCT/KR2022/010869, dated Oct. 28, 2022.
Office Action from corresponding Taiwanese Patent Application No. 111139795, dated Jul. 17, 2023.

* cited by examiner

SURFACE-TREATED COPPER FOIL WITH HEAT RESISTANCE, AND COPPER CLAD LAMINATE AND PRINTED WIRING BOARD INCLUDING THE SAME

CROSS-REFERENCE TO RELATED APPLICATIONS

This application is a National phase entry of PCT/KR2022/010869, filed on 25 Jul. 2022, which claims the benefit and priority to Korean Patent Application No. 10-2021-0185373, filed on 22 Dec. 2021. The entire disclosures of applications identified in this paragraph are incorporated herein by reference.

TECHNICAL FIELD

The present disclosure relates to a surface-treated copper foil and, more specifically, to a surface-treated copper foil, which has long-term high-temperature reliability on a resin substrate and is suitable for use in high-frequency circuits due to a low transmission loss, to a copper clad laminate including same, and to a printed wiring board including same.

BACKGROUND ART

With the acceleration of downsizing and weight reduction of electric/electronic devices, printed circuits formed on substrates have become more sophisticated, highly integrated, and downsized, and thus, copper foils used in printed circuit boards are required to have various properties.

Composite materials for boards used in the manufacture of flexible boards, multilayer boards for high-density mounting, high-frequency circuit boards, and the like (hereinafter, these boards being collectively referred to as "circuit boards" or "printed wiring boards") are formed of a conductor (copper foil) and an insulating substrate (including a resin film) supporting the conductor, and the insulating substrate ensures insulation between conductors and has enough strength to support components.

In order to enhance the adhesive strength between the insulating substrate and the copper foil, the adhesive strength is generally enhanced by an anchoring effect resulting from the attachment of roughening particles on the surface of the copper foil. However, copper foils for high-frequency circuits require low-roughness surface-treated copper foils, and thus such a manner cannot ensure the adhesive strength of the copper foils with the resin substrate. Especially, the adhesive surface between the copper foil and the insulating substrate needs to be exposed to a high-temperature process, such as thermal binding, or a high-temperature environment, but the high-temperature reliability is very difficult to ensure in the adhesive strength between the copper foil and the substrate.

In order to solve this problem, attempts have been made to impart heat resistance by using a heat-resistant resin substrate, such as polytetrafluoroethylene (PTFE) resin, and forming various alloy layers for a conventional Cu particle layer.

However, such alloy layers cause a decrease in etching rate and an increase in transmission loss. Some of the alloy layers, although having heat resistance, cannot ensure long-term high-temperature reliability.

DISCLOSURE

Technical Problem

The present disclosure has been made to solve the above-mentioned problems, and an aspect of the present disclosure is to provide a surface-treated copper foil, a copper clad laminate including same, and a printed wiring board including same, wherein the surface-treated copper foil has high adhesive strength with a resin substrate at a high temperature, has long-term high-temperature reliability in the adhesive strength, and is suitable as a high-frequency foil.

Technical Solution

In accordance with an aspect of the present disclosure, there is provided a surface-treated copper foil having a surface treatment layer, the surface treatment layer including: a primary particle layer containing Cu or Cu alloy particles formed on at least one surface of an original copper foil; and a secondary particle layer containing Zn particles formed on the primary particle layer, wherein the secondary particle layer is composed of particle clusters formed by clustering of a plurality of Zn particles.

The particle clusters may be discontinuously distributed on the primary particle layer.

The surface treatment layer of the surface-treated copper foil preferably has a surface roughness (Rz) of 1.0 μm or less.

In the present disclosure, at least 2 and at most 15 particle clusters may be distributed, on average, in an area of 5 μm×5 μm of the surface-treated copper foil.

The particle size of the secondary particle layer is preferably larger than that of the first primary layer.

The average particle size of the primary particle layer is preferably less than 100 nm. In addition, the average size of the particle clusters of the secondary particle layer is preferably 0.5-2.0 μm.

The Zn concentration of the surface-treated layer is preferably 2000 $\mu g/dm^2$ or more and preferably 3500 $\mu g/dm^2$ or less.

The surface-treated copper foil may further include an anti-rust layer on the secondary particle layer, wherein the anti-rust layer preferably contains chromium.

The original copper foil is preferably an electrolytic copper foil.

In accordance with another aspect of the present disclosure, there is provided a copper clad laminate including the surface-treated copper foil of any one of claims 1 to 10 laminated on a resin substrate. The resin substrate may be a PTFE substrate.

The high-temperature deterioration rate in adhesive strength of the copper clad laminate is preferably less than 10%.

In accordance with still another aspect of the present disclosure, there is provided a printed wiring board manufactured using the above-described copper clad laminate.

According to the present disclosure, there can be provided a surface-treated copper foil, a copper clad laminate including same, and a printed wiring board including same, wherein the surface-treated copper foil has high adhesive strength with a resin substrate at a high temperature, has long-term high-temperature reliability in the adhesive strength, and is suitable as a high-frequency foil.

BEST MODE

The features described in exemplary embodiments and shown in drawings in the present specification are for merely illustrating one of the most preferable exemplary embodiments, but are not intended to represent the technical spirit of the present disclosure, and thus the present disclosure may cover various equivalents and modifications which can substitute for the exemplary embodiments at the time of filing the present application. Hereinafter, exemplary embodiments of the present disclosure will be described in more detail with reference to the accompanying drawings.

A surface-treated copper foil of the present disclosure includes an original foil, a primary particle layer on at least one surface of the original foil, and a secondary particle layer on the primary particle layer. Additionally, the surface-treated copper foil of the present disclosure may further include an anti-rust layer on the secondary particle layer.

Figure 1:
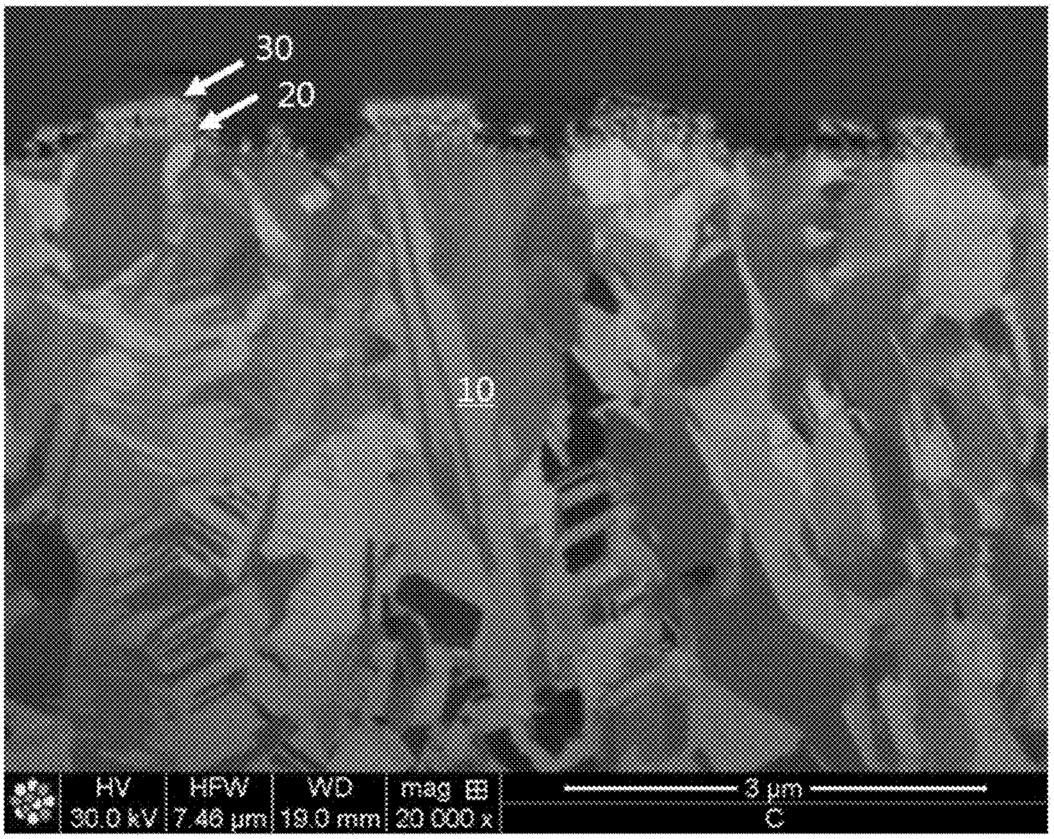
FIG. 1 is an electron microscopic image obtained by photographing a cross-section of a surface-treated copper foil according to an embodiment of the present disclosure.
Figure 2:
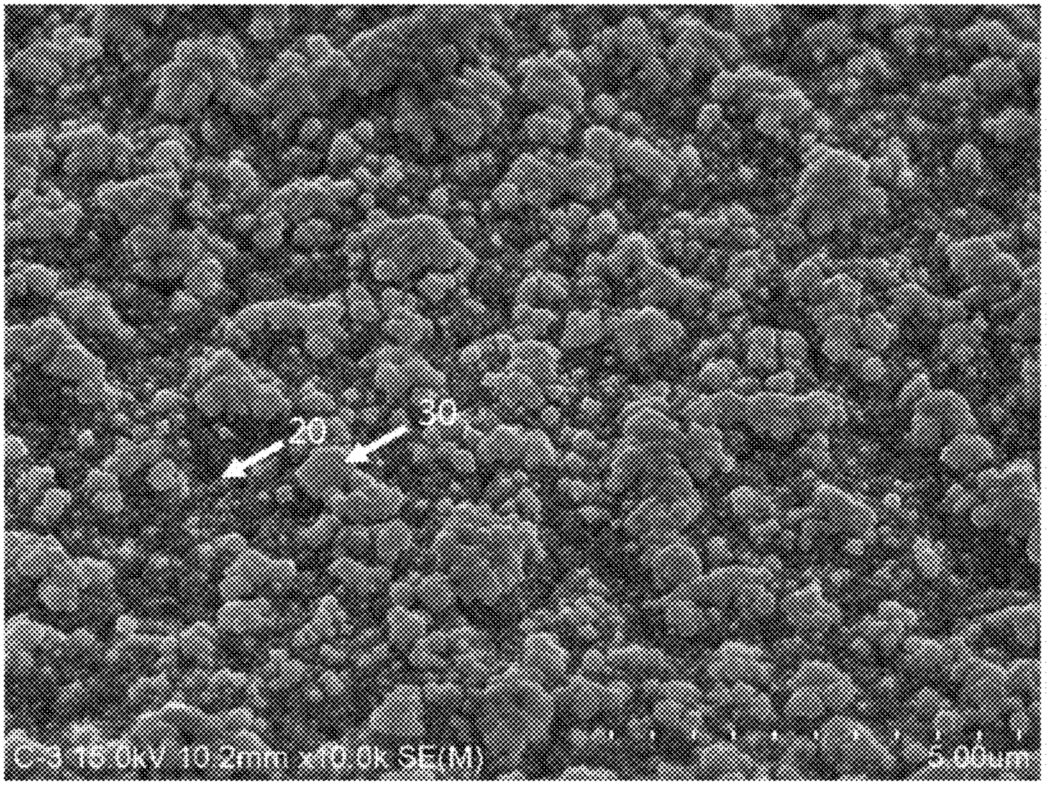
FIG. 2 is an electron microscopic image obtained by photographing a surface of a surface-treated copper foil according to an embodiment of the present disclosure.

FIGS. 1 and 2 are electron microscopic images obtained by photographing a cross-sectional structure and a surface structure of a surface-treated copper foil according to an embodiment of the present disclosure, respectively.

Referring to FIG. 1, a multi-layered surface treatment layer composed of a primary particle layer 20 and a secondary particle layer 30 is formed on one surface of an original foil 10. It can be seen from the picture of FIG. 1 that the primary particle layer 20 covers substantial all the regions of the surface of the original foil but the secondary particle layer 30 is discontinuously distributed on the primary particle layer 20.

Referring to FIG. 2, the secondary particle layer 30 is composed of particle clusters with an average size of 0.5-2 μm appearing relatively bright and the primary particle layer 20 is composed of fine particles with less than 0.1 μm appearing dark, the primary particle layer forming the background of the secondary particle layer. The primary particle layer is formed of Cu particles and the secondary particle layer is formed of Zn particles.

The individual particles in the particle clusters of the secondary particle layer have a size of less than 0.5 μm, but coarse Zn particles that are 2 to 5 times larger compared with the primary particle layer are clustered as a bundle of grapes. It can be also seen that some of the Zn particles constituting the secondary particle layer are in the form of single particles, but most of the particles form a particle cluster by aggregation of two or more particles. It can be seen that these particle clusters have a size of 0.5-2 μm on average. In the present disclosure, the particle clusters are formed in local regions, and some of the particle clusters are isolated from each other.

Hereinafter, the original foil, the primary particle layer, the secondary particle layer, and the anti-rust layer, and manufacturing methods therefor of the present disclosure will be described in detail.

A. Original Foil

In the present disclosure, an original copper foil refers to a copper foil that has not been subjected to surface treatment or anti-rust treatment. A known copper foil may be used without limitation as an original copper foil. According to an embodiment, an untreated copper foil may be an electrolytic copper foil or a rolled copper foil.

In the present disclosure, the thickness of the original copper foil is not particularly limited, but when the surface-treated copper foil is used for a printed wiring board, the thickness of the original foil may be, for example, 6 to 35 μm, and preferably 7 to 17 μm.

In the present disclosure, the original foil preferably has a tensile strength of 35 kgf/mm$^2$ to 60 kgf/mm$^2$, 35 kgf/mm$^2$ to 50 kgf/mm$^2$, or 35 kgf/mm$^2$ to 45 kgf/mm$^2$.

In the present disclosure, the mechanical properties of the original foil are preferably maintained uniform before and after hot pressing during the binding with a prepreg for molding a copper clad laminate or a printed wiring board. In the present disclosure, the original foil has a very small change in crystal grains before and after pressing.

For example, the change rate of the tensile strength value of the original foil after thermal treatment for a predetermined time at a pressure of 4.9 Mpa and a temperature of 220° C. relative to the tensile strength value at room temperature may be less than 5% or less than 3%. In addition, the change rate of elongation of the original foil after thermal treatment for a predetermined time at a pressure of 4.9 Mpa and a temperature of 220° C. relative to the elongation at room temperature may be less than 5% or less than 3%.

B. Primary Particle Layer (Nodular Layer)

In the present disclosure, the primary particle layer may be formed on one surface or both surfaces of the original foil. A surface treatment method for forming the surface treatment layer of the present disclosure is not particularly limited, but the surface treatment layer may be formed by, for example, electroplating of the original foil. As an electrolyte, an aqueous solution containing 5 to a 60 g/L copper salt and 50 to 200 g/L ethylenediaminetetraacetic acid disodium (EDTA-2Na) and adjusted to, for example, pH 1 to 8 (e.g., 6 to 7) may be used. Examples of the copper salt may include copper sulfate ($CuSO_4$), copper nitrate ($Cu(NO_3)_2$), copper chloride ($CuCl_2$), copper acetate ($Cu(CH_3COO)_2$), and the like, and as an additive, at least one selected from the group consisting of citric acid ($C_6H_8O_7$), ethylene diamine tetraacetic acid ($C_{10}H_{16}N_2O_8$), nitrilotriacetic acid ($C_6H_9NO_6$), sodium citrate ($C_6H_5Na_3O_7$), and tartaric acid ($C_4H_6O_6$) may be used, but is not limited thereto. For example, electroplating may be performed by immersing an insoluble electrode as a positive electrode and an untreated original foil as a negative electrode in an electrolyte and conducting electrolysis at a liquid temperature of 25 to 45° C. and a current density of 0.5 to 10 A/dm$^2$ for, for example, 5 to 20 seconds, but is not limited thereto.

In the present disclosure, the primary particle layer is preferably configured of fine copper particles with an average particle diameter of 100 nm or less. For example, the fine copper particles of the primary particle layer may have an average particle diameter of 10 to 100 nm, 20 to 100 nm, or 50 to 100 nm. In the present disclosure, the average particle diameter of the copper particles can be calculated by obtaining a scanning electron microscope (SEM) image and measuring the particle diameter of copper particles through image analysis. The average particle diameter can be calculated by averaging the measurement values of a total of 100 particles. When the average particle diameter of the fine copper particles of the primary particle layer is within such a range, the copper foil has excellent adhesive strength with a resin substrate and is suitable as a high-frequency foil due to a small transmission loss.

C. Secondary Particle Layer

The secondary particle layer may be formed by electroplating the surface-treated foil with the primary particle layer. The electroplating may be performed by using an aqueous solution containing 1-5 g/L zinc and 1-5 g/L phosphoric acid as an electrolyte, immersing the surface-treated foil as a negative electrode in the electrolyte, and conducting electrolysis at a liquid temperature of 25 to 45° C. and a current density of 1 to 3 A/dm$^2$ for, for example, 5 to 10 seconds, but is not limited thereto.

D. Anti-Rust Layer

In the present disclosure, an anti-rust layer may be formed on the secondary particle layer. The anti-rust layer may contain chromium (Cr). The anti-rust layer may contain a metal, such as nickel (Ni), zinc (Zn), cobalt (Co), titanium (Ti), or tin (Sn), instead of or together with chromium.

In the present disclosure, chromate anti-rust treatment may be performed by using an electrolyte of 1-5 g/l chromium and conducting plating at a liquid temperature of 25-35° C. and a current density of 0.5 A/dm$^2$ for 1-5 seconds, followed by washing with water.

In the present disclosure, the surface-treated copper foil may be bound with a low-dielectric resin, a polyimide, or a hydrocarbon or polytetrafluoroethylene film to manufacture a copper clad laminate.

In the present disclosure, the surface roughness (Rz) of the surface-treated copper foil is preferably less than 1.0 μm, and more preferably, the surface roughness of the surface-treated copper foil is in the range of 0.85-0.95. In the present disclosure, the 3D roughness (Sa) of the surface-treated copper foil is preferably 0.3 or more, and more preferably 0.3-0.35.

The above-described surface-treated copper foil laminated on a resin substrate may be used as a copper clad laminate, and such a copper clad laminate may be used to manufacture a printed wiring board.

In the present disclosure, the surface-treated copper foil shows high adhesive strength with a resin substrate, such as a low-dielectric resin, a polyimide, or hydrocarbon or polytetrafluoroethylene, and the surface-treated copper foil, even when exposed to a high temperature for a long time, has a very low possibility of deterioration in adhesive strength.

The surface-treated copper foil of the present disclosure may have an adhesive strength with a PTFE resin of 2.0 kgf/cm or more, 2.5 kgf/cm or more, 2.7 kgf/cm or more, or 2.8 kgf/cm or more. The adhesive strength may be measured based on the JIS C6481 standard.

The surface-treated copper foil of the present disclosure is made into a copper clad laminate by binding with a resin substrate, such as a PTEF resin, and then the deterioration rate (%) of adhesive strength, corresponding to the change rate of the adhesive strength at a temperature of 177° C. after 10 days relative to the adhesive strength value after 1 day, is preferably 10% or less, 9% or less, 8% or less, 7% or less, 6% or less, or 5% or less.

MODE FOR INVENTION

Hereinafter, the present disclosure will be described in detail with reference to examples. However, these examples are shown by way of illustration and should not be construed as limiting the present disclosure in any way.

EXAMPLES

Example 1

An original foil (electrolytic copper foil) with a thickness of 12 μm was immersed in an aqueous solution containing 10-20 g/L copper and 100-200 g/L EDTA-2Na and subjected to plating for 4 seconds under the conditions of a liquid temperature of 25° C., pH 7, and a current density 8 A/dm$^2$, thereby forming a primary particle layer (nodular layer).

Then, the copper foil with the primary particle layer was immersed in an aqueous solution of zinc sulfate (a zinc concentration of 1-5 g/L) and 1-5 g/L phosphoric acid and treated twice for 6 seconds under the conditions of 3.5 A/dm$^2$, thereby forming a secondary particle layer. Thereafter, the surface-treated copper foil was immersed in an aqueous solution of 2 g/L chromium for 3 seconds and washed with water, thereby forming an anti-rust layer. Then, the anti-rust-treated copper foil was immersed in a solution of a silane coupling agent at 1-10 g/L for 3 seconds and then dried with hot air at a temperature of 100° C., thereby preparing a surface-treated copper foil.

Example 2

An original foil with a thickness of 12 μm was immersed in an aqueous solution containing 10-20 g/L copper and 100-200 g/L EDTA-2Na and subjected to plating for 4 seconds under the conditions of a liquid temperature of 25° C., pH 7, and a current density 8 A/dm$^2$, thereby forming a primary particle layer (nodular layer).

Then, the copper foil with the primary particle layer was immersed in an aqueous solution of 1-5 g/L zinc and 1-5 g/L phosphoric acid and treated twice for 6 seconds under the conditions of 2.5 A/dm$^2$, thereby forming a secondary particle layer. Thereafter, the surface-treated copper foil was immersed in an aqueous solution of 2 g/L chromium for 3 seconds and washed with water, thereby forming an anti-rust layer. Then, the anti-rust-treated copper foil was immersed in a solution of a silane coupling agent at 1-10 g/L for 3 seconds and then dried with hot air at a temperature of 100° C., thereby preparing a surface-treated copper foil.

Comparative Example 1

An original foil with a thickness of 12 μm was immersed in an aqueous solution containing 10-20 g/L copper and 100-200 g/L EDTA-2Na and subjected to plating for 4 seconds under the conditions of a liquid temperature of 25° C., pH 7, and a current density 8 A/dm$^2$, thereby forming a primary particle layer (nodular layer).

Then, the copper foil with the primary particle layer was immersed in an aqueous solution of 1-5 g/L zinc and 1-5 g/L phosphoric acid and treated twice for 6 seconds under the conditions of 2.0 A/dm$^2$, thereby forming a secondary particle layer. Thereafter, the surface-treated copper foil was immersed in an aqueous solution of 2 g/L chromium for 3 seconds and washed with water, thereby forming an anti-rust layer. Then, the anti-rust-treated copper foil was immersed in a solution of a silane coupling agent at 1-10 g/L for 3 seconds and then dried with hot air at a temperature of 100° C., thereby preparing a surface-treated copper foil.

Comparative Example 2

An original foil with a thickness of 12 μm was immersed in an aqueous solution containing 10-20 g/L copper and 100-200 g/L EDTA-2Na and subjected to plating for 4 seconds under the conditions of a liquid temperature of 25° C., pH 7, and a current density 8 A/dm$^2$, thereby forming a primary particle layer (nodular layer).

Then, the copper foil with the primary particle layer was immersed in an aqueous solution of 1-5 g/L zinc and 1-5 g/L phosphoric acid and treated twice for 40 seconds under the conditions of 0.5 A/dm$^2$, thereby forming a secondary particle layer. Thereafter, the surface-treated copper foil was immersed in an aqueous solution of 2 g/L chromium for 3 seconds and washed with water, thereby forming an anti-rust layer. Then, the anti-rust-treated copper foil was immersed in a solution of a silane coupling agent at 1-10 g/L for 3 seconds and then dried with hot air at a temperature of 100° C., thereby preparing a surface-treated copper foil.

Comparative Example 3

An original foil with a thickness of 12 μm was immersed in an aqueous solution containing 10-20 g/L copper and 100-200 g/L EDTA-2Na and subjected to plating for 4 seconds under the conditions of a liquid temperature of 25° C., pH 7, and a current density 8 A/dm$^2$, thereby forming a primary particle layer (nodular layer). Then, covering plating for preventing nodular detachment was performed for 3 seconds under conditions of 60-70 g/L, sulfuric acid 120 g/L, and 15 A/dm$^2$.

Then, the covering-plated copper foil was immersed in an aqueous solution of 1-5 g/L zinc and 1-5 g/L phosphoric acid and treated twice for 6 seconds under the conditions of 0.3 A/dm$^2$, thereby forming a secondary particle layer. Thereafter, the surface-treated copper foil was immersed in an aqueous solution of 2 g/L chromium for 3 seconds and washed with water, thereby forming an anti-rust layer. Then, the anti-rust-treated copper foil was immersed in a solution of a silane coupling agent at 1-10 g/L for 3 seconds and then dried with hot air at a temperature of 100° C., thereby preparing a surface-treated copper foil.

Evaluation of Properties

Each of the surface-treated copper foil samples prepared in the examples and comparative examples were measured for properties. Property evaluation items and measurement methods are as follows.

a. Roughness

As for the surface of each of the surface-treated copper foils prepared in the examples and comparative examples, the 10-point average roughness Rz for each of before and after surface treatment of the copper foil was measured using the SURFCOM 1400D (TSK, Tokyo Precision) surface roughness measurement instrument according to the JIS B0601 standards.

b. Three-Dimensional Roughness

As for the surface of each of the surface-treated copper foils prepared in the examples and comparative examples, three-dimensional roughness was determined by measuring the shape of minute stepped portions of an object in a non-contact manner through a 3D Profiler, NV-2200, by Nanosystems.

c. Average Particle Diameter of Primary Particle Layer

The primary particle layer was formed on the surface of the original foil in each of the examples and comparative examples, and then immediately, an FE-SEM image of the surface was photographed using a scanning electron microscope. The particle diameters of 100 copper particles in an area of 5 μm×5 μm were measured and averaged.

d. Average Particle Diameter of Secondary Particle Layer

The secondary particle layer was formed in each of the examples and comparative examples, and then immediately, an FE-SEM image of the surface was photographed using a scanning electron microscope. The particle diameters of 50 secondary particles in an area of 5 μm×5 μm were measured and averaged, thereby obtaining an average particle diameter.

e. Adhesive Strength (Unit: kgf/cm)

A copper foil specimen was prepared with a width of 10 mm and pressed on Teflon resin at 380° C., thereby preparing a sample. The adhesive strength was investigated by the 90° peel method according to JIS C 6471 8.1. A Teflon product with a thickness of 50 μm, which was the product name EA-2000 by AGC, was used as an insulator.

f. Particle Amount of Secondary Particle Layer

A 10×10 cm sample of surface-treated copper foil was prepared, immersed in a hydrochloric acid solution to melt the surface with a thickness of 1 μm, and then the crude solution was measured by ICP analysis to measure the particle amount of the secondary particle layer (Zn).

g. High-Temperature Deterioration Rate in Adhesive Strength

The sample, which had been hot-pressed on Teflon resin and checked for adhesive strength, was measured for adhesive strength by the above method, and the measurement value was then set as a reference value. Thereafter, the corresponding sample was kept in an oven at a temperature of 177° C. for 10 days, and then measured for adhesive strength. The change rate on the basis of the reference value was calculated as a high-temperature deterioration rate (%) in adhesive strength.

Table 1 below shows measured property values.

TABLE 1

| Classification | Roughness (Rz) | 3D roughness (Sa) | Size of primary particles | Size of secondary particles | Particle amount of secondary particles (μg/dm$^2$) | Adhesive strength (1 day) | Adhesive strength (177° C., after 10 days) | Deterioration rate (%) |
|---|---|---|---|---|---|---|---|---|
| Example 1 | 0.9 | 0.32 | <100 nm | >100 nm | 2790 | 3.0 | 2.97 | 1% |
| Example 2 | 0.9 | 0.31 | <100 nm | >100 nm | 2450 | 3.0 | 2.79 | 7% |
| Comparative Example 1 | 1.0 | 0.29 | <100 nm | >100 nm | 1990 | 3.0 | 1.49 | 49% |
| Comparative Example 2 | 1.0 | 0.22 | <100 nm | — | 3000 | 3.0 | 0.12 | >90% |
| Comparative Example 3 | 1.5 | 0.83 | >500 nm | — | 300 | 3.0 | 0.13 | >90% |

Figure 3A:
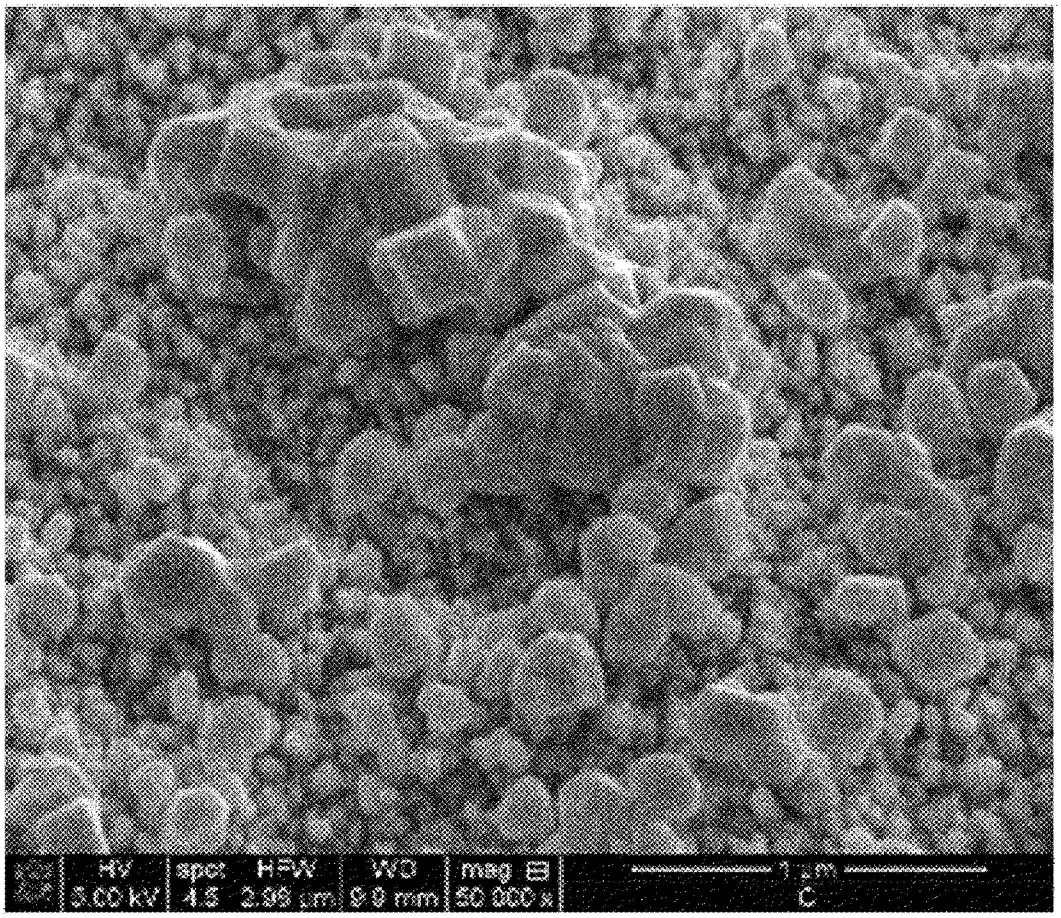
FIGS. 3A and 3B are electron microscopic images obtained by observing surfaces of surface-treated copper foils prepared in an example and a comparative example, respectively.
Figure 3B:
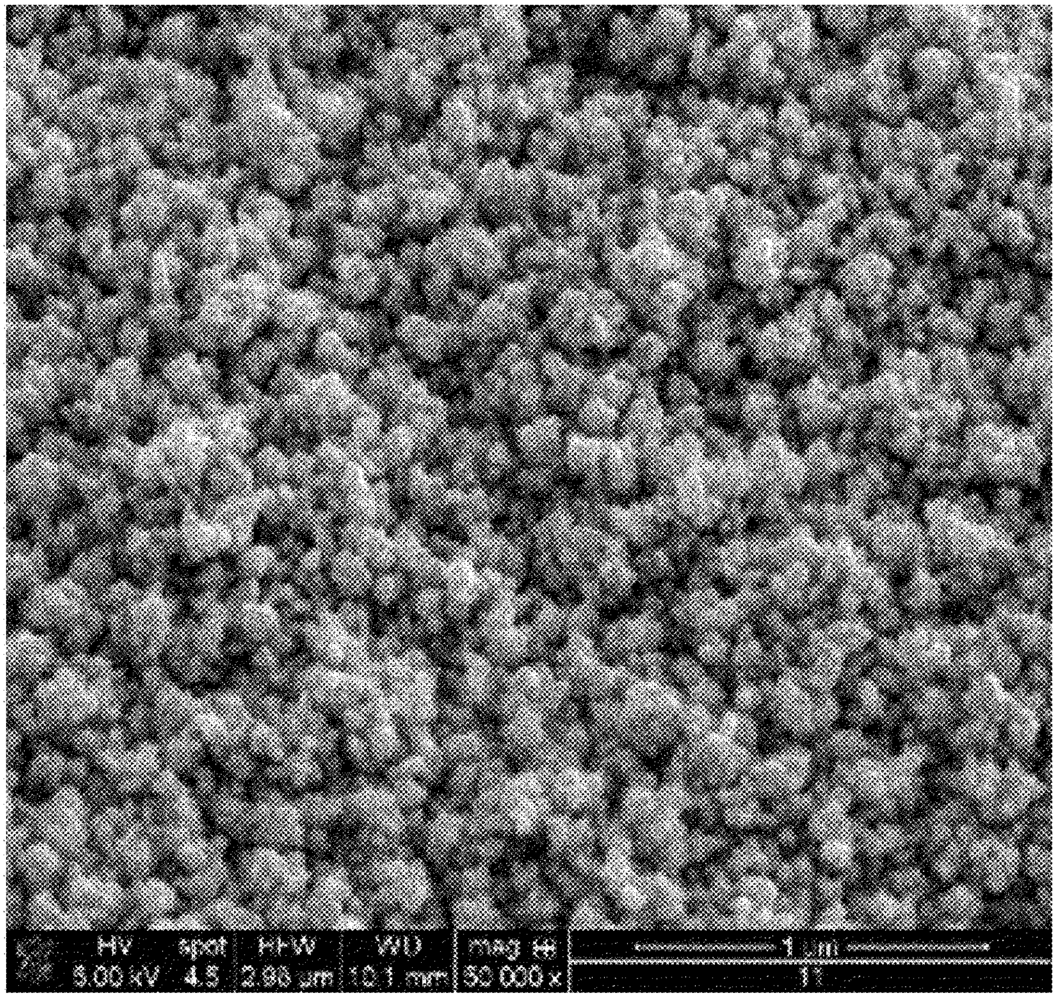

FIGS. 3A and 3B are electron microscopic images obtained by observing the surfaces of the surface-treated copper foils prepared in Example 1 and Comparative Example 2, respectively.

Referring to FIG. 3, in Example 1, a particle cluster-structured secondary particle layer composed of coarser particles than the primary particle layer of the background on the surface was formed. However, in Comparative Example 2, no particle cluster structure was developed. It seems that Zn supplied as a secondary particle source was evenly deposited on the particle surface of the primary particle layer rather than forming a separate layer. This was also observed in Comparative Example 3, indicating a very low value of deterioration rate.

In Comparative Example 1, a particle cluster structure was formed, but the particle amount of the secondary particle layer was lower than those in Examples 1 and 2, and this cause was considered to cause a rapid increase in the deterioration rate.

Although the present disclosure has been described through a certain embodiment, it shall be appreciated that various permutations and modifications of the described embodiment are possible by those skilled in the art to which the present disclosure pertains without departing from the scope of the present disclosure. Therefore, the scope of the present disclosure shall not be defined by the described embodiment but shall be defined by the appended claims and their equivalents.

INDUSTRIAL APPLICABILITY

The present disclosure is applicable to electrolytic copper foils, COPPER CLAD LAMINATE AND PRINTED WIRING BOARD.

What is claimed is:

1. A surface-treated copper foil having a surface treatment layer, the surface treatment layer comprising: a primary particle layer containing Cu or Cu alloy particles formed on at least one surface of an original copper foil; and a secondary particle layer containing Zn particles formed on the primary particle layer, wherein the secondary particle layer is composed of particle clusters formed by clustering a plurality of Zn particles, and wherein the particle size of the secondary particle layer is larger than that of the primary particle layer.

2. The surface-treated copper foil of claim 1, wherein the particle clusters are discontinuously distributed on the primary particle layer.

3. The surface-treated copper foil of claim 1, wherein the surface treatment layer of the surface-treated copper foil has a surface roughness (Rz) of 1.0 μm or less.

4. The surface-treated copper foil of claim 1, wherein, on average, at least two particle clusters are distributed in an area of 5 μm×5 μm of the surface-treated copper foil.

5. The surface-treated copper foil of claim 1, wherein at most 15 particle clusters are distributed in an area of 5 μm×5 μm of the surface-treated copper foil.

6. The surface-treated copper foil of claim 1, wherein the average particle size of the primary particle layer is less than 100 nm, and the average size of the particle clusters of the secondary particle layer is 0.5-2.0 μm.

7. The surface-treated copper foil of claim 1, wherein the Zn concentration of the surface-treated layer is 2000 μg/dm2 or more.

8. The surface-treated copper foil of claim 1, wherein the Zn concentration of the surface-treated layer is 3500 μg/dm2 or less.

9. The surface-treated copper foil of claim 1, further comprising an anti-rust layer on the secondary particle layer.

10. The surface-treated copper foil of claim 9, wherein the anti-rust layer contains chromium.

11. The surface-treated copper foil of claim 1, wherein the original copper foil is an electrolytic copper foil.

12. A copper clad laminate comprising the surface-treated copper foil of claim 1 laminated on a resin substrate.

13. The copper clad laminate of claim 12, wherein the resin substrate is a PTFE substrate.

14. The copper clad laminate of claim 12, wherein the high-temperature deterioration rate in adhesive strength of the copper clad laminate is less than 10%.

15. A printed wiring board manufactured using the copper clad laminate of claim 12.

* * * * *